(12) United States Patent
Xie et al.

(10) Patent No.: US 9,935,018 B1
(45) Date of Patent: Apr. 3, 2018

(54) METHODS OF FORMING VERTICAL TRANSISTOR DEVICES WITH DIFFERENT EFFECTIVE GATE LENGTHS

(71) Applicant: GLOBALFOUNDRIES Inc., Grand Cayman (KY)

(72) Inventors: Ruilong Xie, Niskayuma, NY (US); Chun-Chen Yeh, Danbury, CT (US); Tenko Yamashita, Schenectady, NY (US); Kangguo Cheng, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/436,281

(22) Filed: Feb. 17, 2017

(51) Int. Cl.
| | | |
|---|---|---|
| *H01L 21/00* | (2006.01) | |
| *H01L 27/00* | (2006.01) | |
| *H01L 29/00* | (2006.01) | |
| *H01L 21/8238* | (2006.01) | |
| *H01L 21/324* | (2006.01) | |

(Continued)

(52) U.S. Cl.
CPC .. *H01L 21/823885* (2013.01); *H01L 21/3085* (2013.01); *H01L 21/30604* (2013.01); *H01L 21/324* (2013.01); *H01L 21/82385* (2013.01); *H01L 21/823814* (2013.01); *H01L 21/823864* (2013.01); *H01L 27/092* (2013.01); *H01L 29/42376* (2013.01); *H01L 29/6656* (2013.01);

(Continued)

(58) Field of Classification Search
CPC ....... H01L 21/823885; H01L 21/30604; H01L 21/3085; H01L 21/324; H01L 21/823814; H01L 21/82385; H01L 21/823864; H01L 27/092; H01L 27/088; H01L 27/105; H01L 29/42376; H01L 29/6656; H01L 29/66666; H01L 29/7827
See application file for complete search history.

(56) References Cited

U.S. PATENT DOCUMENTS

| | | |
|---|---|---|
| 5,342,797 A | 8/1994 | Sapp et al. |
| 5,414,289 A | 5/1995 | Fitch et al. |

(Continued)

OTHER PUBLICATIONS

Notice of Allowance from related U.S. Appl. No. 15/132,383 dated Jul. 21, 2017.

(Continued)

*Primary Examiner* — Nikolay Yushin
(74) *Attorney, Agent, or Firm* — Amerson Law Firm, PLLC (57) ABSTRACT

One illustrative method disclosed herein includes, among other things, forming first and second vertically-oriented channel (VOC) semiconductor structures for, respectively, first and second vertical transistor devices, and forming first and second top spacers, respectively, around the first and second VOC structures, wherein the first spacer thickness is greater than the second spacer thickness. In this example, the method also includes performing at least one epitaxial deposition process to form a first top source/drain structure around the first VOC structure and above the first top spacer and a second top source/drain structure around the second VOC structure and above the second top spacer, and performing an anneal process so as to cause dopants in the first and second doped top source/drain structures to migrate into, respectively, the first and second VOC structures.

20 Claims, 7 Drawing Sheets

(51) Int. Cl.
  *H01L 21/306* (2006.01)
  *H01L 21/308* (2006.01)
  *H01L 29/66* (2006.01)
  *H01L 27/092* (2006.01)
  *H01L 29/78* (2006.01)
  *H01L 29/423* (2006.01)

(52) U.S. Cl.
  CPC .... *H01L 29/66666* (2013.01); *H01L 29/7827* (2013.01)

(56) References Cited

U.S. PATENT DOCUMENTS

| | | | |
|---|---|---|---|
| 6,372,559 B1 | 4/2002 | Crowder et al. | |
| 6,686,604 B2 | 2/2004 | Layman et al. | |
| 6,690,040 B2 | 2/2004 | Chaudhry et al. | |
| 6,759,730 B2 | 7/2004 | Chaudhry et al. | |
| 7,241,655 B2 | 7/2007 | Tang et al. | |
| 7,465,622 B2 | 12/2008 | Lin | |
| 7,666,733 B2 | 2/2010 | Delconibus | |
| 7,700,432 B2 | 4/2010 | Chaudhry et al. | |
| 8,637,849 B2 | 1/2014 | Deligianni et al. | |
| 8,962,434 B2 * | 2/2015 | Cheng | H01L 21/82341 438/183 |
| 9,177,785 B1 | 11/2015 | Kelly et al. | |
| 9,224,840 B2 | 12/2015 | Flachowsky et al. | |
| 9,278,362 B2 | 3/2016 | Basu et al. | |
| 9,385,195 B1 | 7/2016 | Zhang | |
| 9,530,863 B1 | 12/2016 | Zhang et al. | |
| 9,530,866 B1 | 12/2016 | Zhang et al. | |
| 9,640,636 B1 | 5/2017 | Bentley et al. | |
| 9,660,028 B1 | 5/2017 | Cheng et al. | |
| 2003/0047749 A1 | 3/2003 | Chaudhry et al. | |
| 2003/0119237 A1 | 6/2003 | Chittipeddi et al. | |
| 2007/0111414 A1 | 5/2007 | Chaudhry et al. | |
| 2008/0054350 A1 | 3/2008 | Breitwisch et al. | |
| 2009/0085088 A1 | 4/2009 | Takaishi | |
| 2010/0171163 A1 | 7/2010 | Kim et al. | |
| 2011/0253981 A1 | 10/2011 | Rooyackers et al. | |
| 2013/0341270 A1 | 12/2013 | Kar et al. | |
| 2014/0015014 A1 * | 1/2014 | Cheng | H01L 29/167 257/288 |
| 2014/0353593 A1 | 12/2014 | Smets | |
| 2015/0091100 A1 | 4/2015 | Xie et al. | |
| 2015/0137271 A1 | 5/2015 | Cai et al. | |
| 2016/0005850 A1 | 1/2016 | Zhao et al. | |
| 2016/0284712 A1 | 9/2016 | Liaw | |
| 2017/0229472 A1 | 8/2017 | Lu et al. | |

OTHER PUBLICATIONS

Hergenrother et al., "The Vertical Replacement-Gate (VRG) MOSFET: A 50-nm Vertical MOSFET with Lithography-Independent Gate Length," IEDM 99-7 5, IEEE 1999.
Notice of Allowance from related U.S. Appl. No. 15/097,574 dated Sep. 14, 2016.
Notice of Allowance from related U.S. Appl. No. 15/097,621 dated Sep. 19, 2016.
Office Action from related U.S. Appl. No. 15/268,796 dated Jan. 12, 2018.

* cited by examiner

METHODS OF FORMING VERTICAL TRANSISTOR DEVICES WITH DIFFERENT EFFECTIVE GATE LENGTHS

BACKGROUND OF THE INVENTION

1. Field of the Invention

Generally, the present disclosure relates to the manufacture of semiconductor devices, and, more specifically, to various novel methods of forming vertical transistor devices with different effective gate lengths and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned between the source/drain regions. Upon application of an appropriate control voltage to the gate electrode, a conductive channel region forms between the drain region and the source region.

Figure 1:
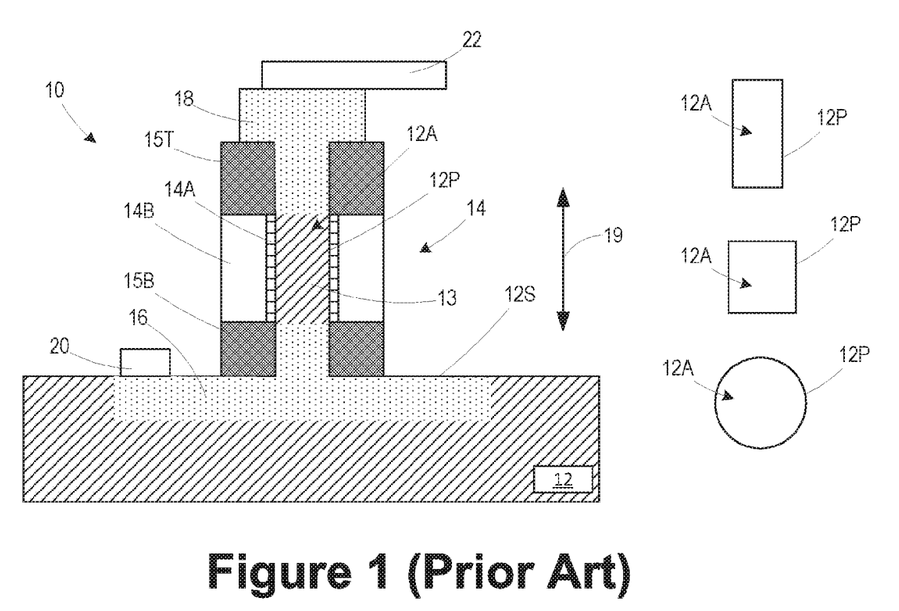
FIG. 1 simplistically depicts an illustrative prior art vertical transistor device.

FIG. 1 is a simplistic and schematic depiction of an illustrative prior art vertical transistor device 10. In general, the vertical transistor 10 comprises a generally vertically-oriented channel semiconductor structure 12A that extends upward from a front surface 12S of a semiconductor substrate 12. As indicated in the right-hand portion of FIG. 1, the semiconductor structure 12A may have a variety of different configurations when viewed from above, e.g., circular, rectangular, square, etc., and it has an outer perimeter 12P. The device 10 further comprises a channel region 13, a gate-all-around (GAA) gate structure 14 that is positioned around the perimeter 12P of the semiconductor structure 12A, a bottom source/drain (S/D) region 16, a top S/D region 18, a bottom spacer 15B, and a top spacer 15T. Also depicted is an illustrative bottom contact 20 that is conductively coupled to the bottom S/D region 16 and a top contact 22 that is conductively coupled to the top S/D region 18. In the depicted example, the gate structure 14 comprises a gate insulation layer 14A and a conductive gate electrode 14B. The materials of construction for the components of the device 10 may vary depending upon the particular application. The gate structure 14 may be manufactured using well-known gate first or replacement gate manufacturing techniques. The gate-length of the vertical transistor device is in the direction indicated by the double-arrow line 19. In one example, when the transistor is turned "ON" by applying the appropriate voltage to the gate electrode 14B, current flows from the bottom source/drain region 16, through the channel region 13 to the top S/D region 18.

Device designers and manufacturers are constantly in search of device designs and methods of manufacturing that improve device performance, processing efficiencies and/or product yields. Device designers are investigating the possibility of using vertical transistor devices in advanced integrated circuit (IC) products. However, a typical CMOS-based IC chip design requires the use of transistors with different characteristics, e.g., switching speed and power consumption, so as to enable device designers to enhance the performance and power consumption of the overall circuit. Thus, the present disclosure is directed to methods of forming vertical transistor devices with different effective gate lengths and the resulting devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming vertical transistor devices with different effective gate lengths and the resulting devices. One illustrative method disclosed herein includes, among other things, forming first and second vertically-oriented channel semiconductor structures for, respectively, first and second vertical transistor devices and forming first and second top spacers, respectively, around the first and second vertically-oriented channel semiconductor structures, wherein the first spacer thickness is greater than the second spacer thickness. In this example, the method also includes performing at least one epitaxial deposition process to form a first doped top source/drain structure around the first vertically-oriented channel semiconductor structure and above the first top spacer and a second doped top source/drain structure around the second vertically-oriented channel semiconductor structure and above the second top spacer, and performing an anneal process so as to cause dopants in the first and second doped top source/drain structures to migrate into, respectively, the first and second vertically-oriented channel semiconductor structures.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the vertical transistor device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 2A-2L depict multiple illustrative novel methods of forming vertical transistor devices with different effective gate lengths on an integrated circuit (IC) product 100 that includes a plurality of illustrative vertical transistor devices 101A, 101B (which will be collectively referenced using the numeral 101) each including, respectively, a vertically-oriented channel semiconductor structure 110A, 110B (which will be collectively referenced using the numeral 110). The devices 101A, 101B may be the same type of device, e.g., they both may be N-type devices, or they may be devices of opposite type. Of course, the IC product 100 may typically include millions of such vertical transistor devices 101. In the illustrated examples, the vertical transistor devices 101 have a rectangular cross-section when viewed from above. In other embodiments, the vertical transistor devices 101 may have different cross-section shapes, such as circle, oval, square, etc. (as depicted in the prior art structure 10 of FIG. 1). Additionally, as shown in the simplistic offset plan view in FIG. 2A, in the depicted example, the vertically-oriented channel semiconductor structures 110 have opposing lateral sidewall surfaces 110X, a top surface 110Y and opposing end surfaces 110E.

Figure 2A:
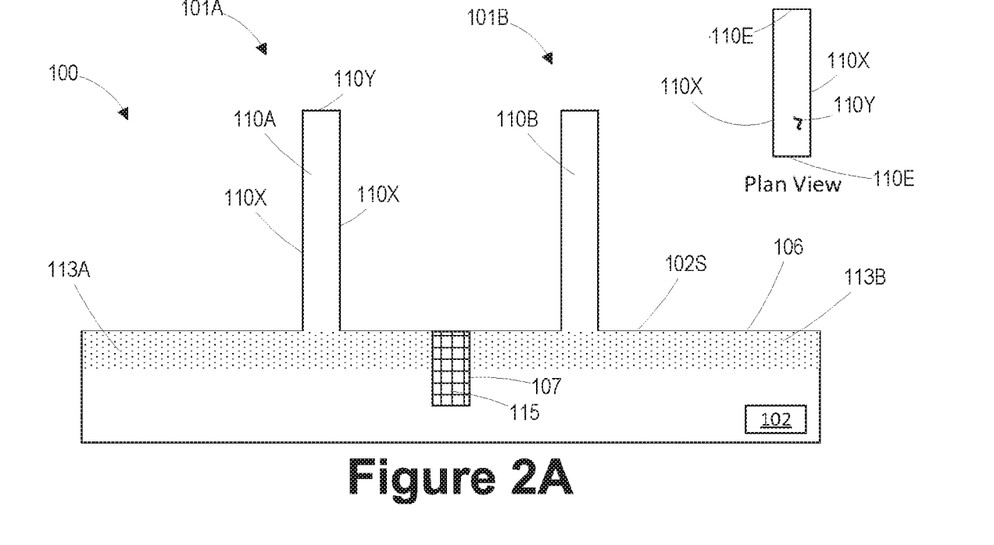
FIGS. 2A-2L depict various illustrative novel methods disclosed herein for forming vertical transistor devices with different effective gate lengths and the resulting devices.

FIGS. 2A-2L depict multiple illustrative process flow wherein two illustrative vertically-oriented channel semiconductor structures 110 will be formed above a semiconductor substrate 102. The substrate 102 may have a variety of configurations, such as a bulk semiconductor (e.g., silicon) configuration. The substrate 102 may have a bulk configuration (as depicted in FIG. 2A) with an upper surface 102S or a semiconductor-on-insulator or silicon-on-insulator (SOI) configuration (not shown) that includes a bulk semiconductor layer, a buried insulation layer (e.g., silicon dioxide), and an active layer (e.g., silicon), wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. In other applications, the vertically-oriented channel semiconductor structures 110 may be comprised of an alternative semiconductor material, i.e., a semiconductor material other than the semiconductor material of the substrate 102. For example, in the case where the substrate 102 is made of a traditional silicon material, the alternative semiconductor material may be a material such as silicon-germanium ($Si_{(1-x)}Ge_{(x)}$), substantially pure germanium (Ge), a III-V compound semiconductor material, etc.

FIG. 2A depicts one illustrative embodiment of the IC product 100 including the vertical transistor devices 101 disclosed herein at a stage of fabrication after several process operations have already been performed. First, the vertically-oriented channel semiconductor structures 110 were formed by performing one or more etching processes through a patterned etch mask (not shown) so as to define a plurality of trenches 106 in the substrate 102. In some embodiments, the patterned etch mask may be comprised of one or more layers of material and it may be formed by forming one or more layers of material and thereafter patterning those materials using known photolithography and etching techniques. In one illustrative embodiment, the patterned etch mask may be comprised of a layer of silicon dioxide and a layer of silicon nitride. Then, an etching process was performed through another patterned etch mask (not shown) to define an isolation trench 107 in the substrate between the vertically-oriented channel semiconductor structures 110. A layer of insulating material, such as silicon dioxide, was then deposited so as to over-fill the trenches 106 such that insulating material is positioned above the upper surfaces 110Y of the vertically-oriented channel semiconductor structures 110. Thereafter, a CMP process was performed to planarize the upper surface of the deposited layer of insulating material with the upper surfaces 110Y of the vertically-oriented channel semiconductor structures 110. At that point, a recess etching process was performed to recess the layer of insulating material such that the insulating material is approximately level with the bottom of the trenches 106 while portions of the insulating material remain positioned in the isolation trench 107 defined in the substrate so as to thereby define the isolation structure 115.

Next, in one illustrative embodiment, one or more ion implantation processes was performed to form bottom source/drain (S/D) regions 113A, 113B (generally referred to with the reference numeral 113) for the devices 101A, 101B, respectively, in the substrate 102. As noted above, the devices 101A, 101B may be the same type of device, e.g., they both may be N-type devices, or they may be devices of opposite type, as in a CMOS application. If the devices 101 are opposite-type devices, then two separate implantation processes would be performed through different patterned implantation masks (not shown). However, for purposes of simplicity, the bottom source/drain (S/D) regions 113 are shaded the same in the drawings so as to not overly complicate the disclosure of the present invention. The bottom source/drain (S/D) regions 113 may be doped with an appropriate dopant (e.g., N-type or P-type) depending upon the type of device 101 under construction.

Figure 2B:
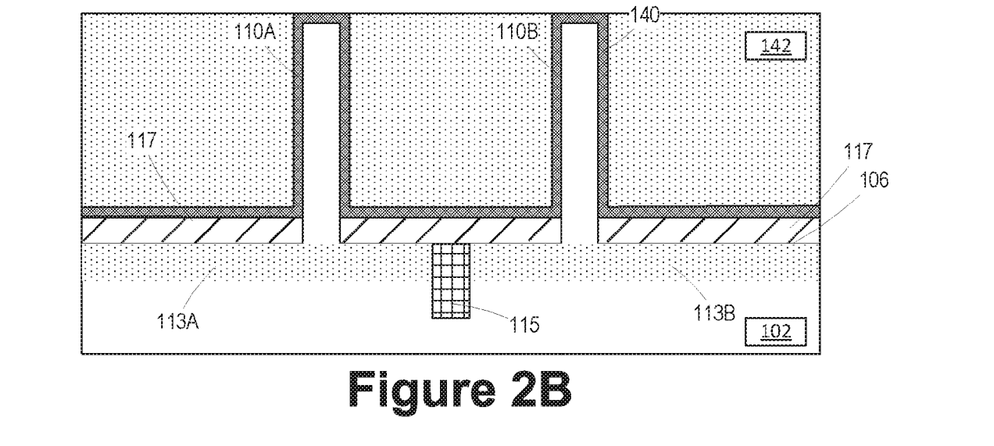

FIG. 2B depicts the product 100 after several process operations were performed. First, a bottom spacer 117 for each device 101 was formed in the trenches 106. The bottom spacer 117 may be formed to any desired thickness, e.g., 4-15 nm, and it may be formed from any desired insulating material, e.g., a low-k insulating material (k value of 7 or less), silicon dioxide, etc. In one embodiment, the bottom spacer 117 may be formed by performing a deposition process so as to over-fill the trenches 106. Thereafter, the upper surface of the layer of insulating material may be planarized by performing, for example, a CMP process. Then, a timed selective recess etching process was performed to recess the layer of insulating material to a desired residual thickness thereby forming the bottom spacer 117. In another embodiment, the bottom spacer 117 may be formed by performing a directional deposition process, such as a gas cluster ion beam (GCIB) process, to form the material of the bottom spacer 117 substantially on only the horizontally oriented surfaces of the product 100, i.e., in the bottom of the trenches 106 and on the upper surfaces 110Y of the vertically-oriented channel semiconductor structures 110, which is not shown in the depicted example as the formation of the material 117 on the upper surfaces 110Y of the vertically-oriented channel semiconductor structures 110 is not required for purposes of the presently disclosed inventions.

With continuing reference to FIG. 2B, after the formation of the bottom spacer 117, a conformal deposition process was performed to form a gate insulation layer 140 on the vertically-oriented channel semiconductor structures 110 and above the bottom spacer 117 (and perhaps any bottom spacer material 117 that was formed on top of the vertically-oriented channel semiconductor structures 110 if a directional deposition process was performed). The gate insulation layer 140 may be formed to any desired thickness, e.g., 1-5 nm, and it may be formed from any desired insulating material, e.g., a high-k insulating material (k value of 10 or more), hafnium oxide, etc. Next, a deposition process was performed to form a gate conductive material layer 142 across the product. Thereafter, a CMP process that stops on the gate insulation layer 140 was performed to planarize the upper surface of the gate conductive material layer 142. The gate conductive material layer 142 may be formed from any desired conductive material (or combinations thereof), e.g., a work function material such as TiAl, Al doped TiN, a metal, a metal alloy, etc. Collectively, the gate insulation layer 140 and the gate conductive material layer 142 will be generally referred to as a "gate structure" of the devices 101. As will be appreciated by those skilled in the art after a complete reading of the present application, the gate structures for the devices 101 may be made using well-known gate-first (illustratively depicted herein) or replacement-gate manufacturing techniques (in which case the layers 140 and 142 would be sacrificial in nature), while still practicing at least some of the various inventions disclosed herein. Additionally, as noted above, the devices 101A, 101B may be the same type of device, e.g., they both may be N-type devices, or they may be devices of opposite type, as in a CMOS application. If the devices 101 are opposite-type devices, the gate structures for the devices may be comprised of different materials, e.g., different work function metals. Moreover, in the case where the devices 101A, 101B are different type devices, the formation of the gate structures for the devices may involve performing multiple deposition and etch processes through patterned mask layers so as to form different gate materials for the different devices. Additionally, in one particular example, the vertically-oriented channel semiconductor structures 110 of both of the devices 101A, 101B may have substantially the same physical size, e.g., substantially the same cross-sectional configuration, substantially the same vertical height and "foot-print" dimensions (when viewed from above), and have substantially the same overall configuration, e.g., rectangular, circular, etc., when viewed from above, but such substantially uniformity of the vertically-oriented channel semiconductor structures 110 may not be required in all applications and should not be considered to be any limitation on the subject matter disclosed and claimed herein.

Figure 2C:
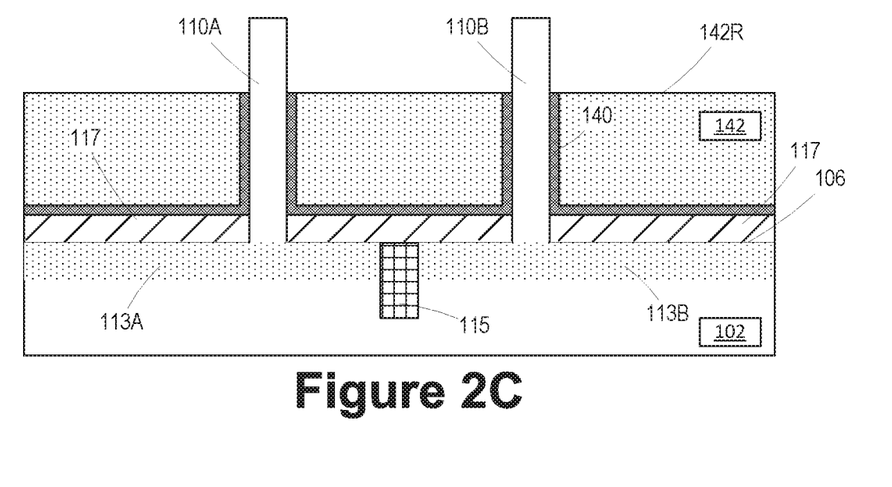

FIG. 2C depicts the product 100 after one or more timed recess etching processes were performed to recess the gate insulation layer 140 and the gate conductive material layer 142 to a desired residual vertical thickness (which may vary depending upon the application), e.g., the remaining vertical height of the gate insulation layer may be on the order of about 10-40 nm. This process operation exposes approximately the same vertical height of each of the vertically-oriented channel semiconductor structures 110 above the recessed upper surface 142R of the gate conductive material layer 142. The remaining recessed gate materials cover portions of the vertically-oriented channel semiconductor structures 110 that will become channel portions of the devices 101A, 101B.

Figure 2D:
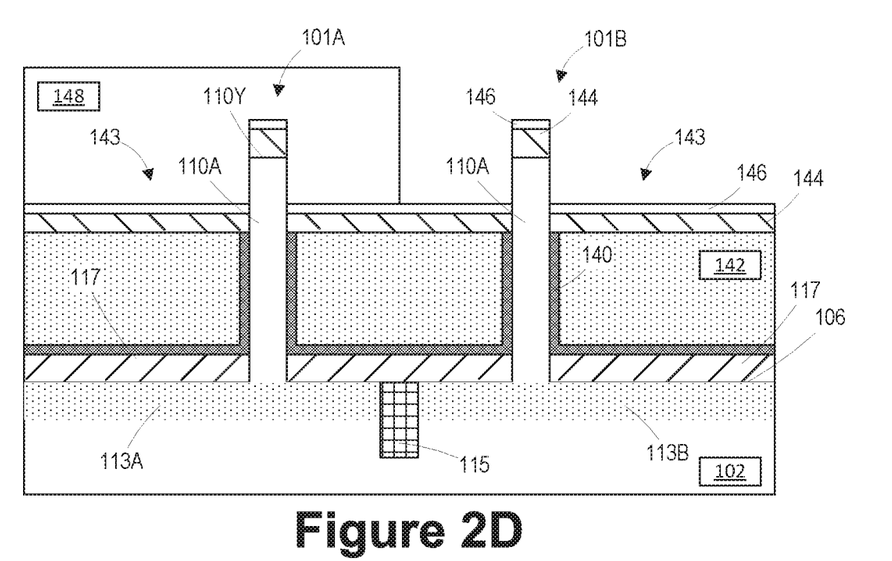

FIG. 2D depicts the product 100 after several process operations were performed. The first operation to be performed relates to the formation of a top spacer (generally referred to with the reference numeral 143) for both of the devices 101. In the depicted example, a first directional deposition process, such as a gas cluster ion beam (GCIB) process, was performed to form a first layer of top spacer material 144 above the recessed gate conductive material layer 142 and recessed gate insulation layer 140 and on the upper surface 110Y of the vertically-oriented channel semiconductor structures 110. In general, the directional deposition process results in the formation of the material 144 on the substantially horizontally oriented surfaces, such as above the upper surface 110Y of the vertically-oriented channel semiconductor structures 110, without forming appreciable amounts of the material 144 on vertically oriented sidewall surfaces of the vertically-oriented channel semiconductor structures 110. The first layer of top spacer material 144 may be formed to any desired as-deposited vertical thickness, e.g., 4-15 nm, and it may be formed from any desired insulating material, e.g., a low-k insulating material (k value of 7 or less), silicon dioxide, etc. In some applications, the first layer of top spacer material 144 may be made of the same material as that of the bottom spacer 117, but they may also be made of different materials if desired. Alternatively, the first layer of top spacer material 144 may be formed by depositing the material for the first layer of top spacer material 144 so as to over-fill the remaining portions of the trenches 106 and thereafter performing a recess etching process on the material of the first layer of top spacer material 144. If desired, after the first layer of top spacer material 144 is formed, a brief isotropic etch-back process may be performed to remove any portions of the first layer of top spacer material 144 that might have formed on the sidewalls of the vertically-oriented channel semiconductor structures 110.

With continuing reference to FIG. 2D, the next process involves performing a second directional deposition process, (e.g., a GCIB process) to form a second layer of top spacer material 146 above the first layer of top spacer material 144 and above the vertically-oriented channel semiconductor structures 110. The second layer of top spacer material 146 may be formed to any desired as-deposited vertical thickness, e.g., 1-6 nm, and it may be formed from any desired insulating material, e.g., a low-k insulating material (k value of 7 or less), silicon dioxide, etc., as long as the material of the second layer of top spacer material 146 may be selectively etched relative to the material of the first layer of top spacer material 144. In one illustrative embodiment, if the first layer of top spacer material 144 is comprised of, for example, SiCBN or SiCO, then the second layer of top spacer material 146 may be comprised of silicon nitride. In some applications, the combined vertical thickness of the layers 144 and 146 for the top spacer may be approximately equal to the vertical thickness of the bottom spacer 117, but that may not be the case in all applications. If desired, after the second layer of top spacer material 146 is formed, a brief isotropic etch-back process may be performed to remove any portions of the second layer of top spacer material 146 that might have formed on the sidewalls of the vertically-oriented channel semiconductor structures 110. In the example depicted herein, the formation of top spacers 143 for the devices 101 involves a process flow wherein two layers of top spacer material (144 and 146) are formed during the process flow. But as will be appreciated by those skilled in the art after a complete reading of the present application, the top spacers 143 may be formed by forming more than two layers of top spacer material using the methods disclosed herein. Thereafter, a patterned etch mask layer 148, e.g., photoresist, was formed so as to cover the device 101A while exposing the device 101B.

Figure 2E:
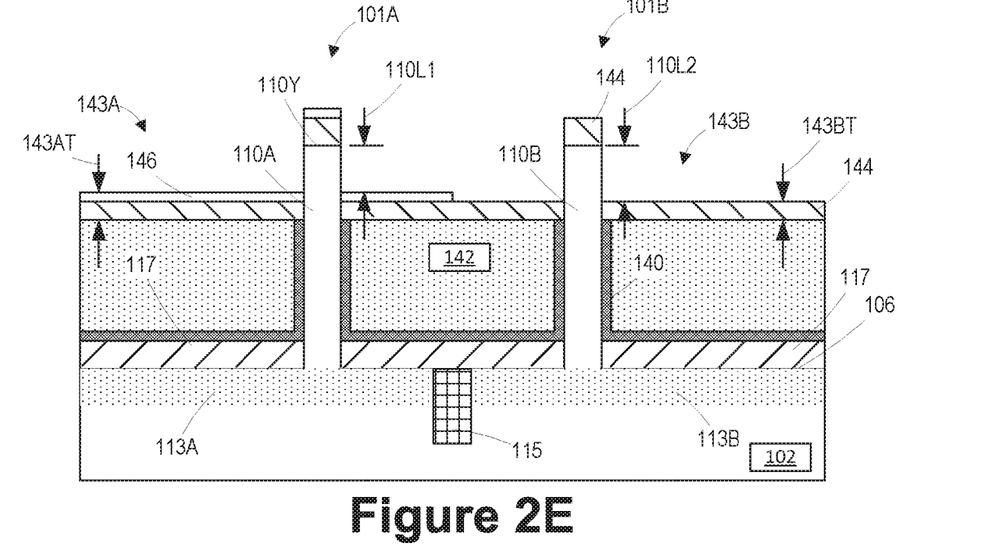

FIG. 2E depicts the product 100 after several process operations were performed. First, an etch process was performed through the patterned etch mask layer 148 to remove exposed portions of the second layer of top spacer material 146 on the device 101B selectively relative to the first layer of top spacer material 144. Thereafter, the patterned etch mask layer 148 was removed. This process operation results in the formation of a top spacer 143A with a first vertical spacer thickness 143AT for the device 101A and a top spacer 143B with a second vertical spacer thickness 143BT for the device 101B, wherein the first thickness 143AT is greater than the second thickness 143BT. The difference in the first and second thicknesses 143AT and 143BT may vary depending upon the application, e.g., 1-6 nm. Additionally, it should be noted that the first thickness 143AT and/or the second thickness 143BT need not match the vertical thickness of the bottom spacer 117, although one of the first and second thicknesses 143AT or 143BT may match the thickness of the bottom spacer 117 in some applications. It should also be noted that, due to the differences in the first and second thicknesses 143AT and 143BT of the top spacers 143A and 143B, respectively, this process operation exposes a vertical height 110L1 of the vertically-oriented channel semiconductor structure 110A on the device 101A that is less than a vertical height 110L2 of the vertically-oriented channel semiconductor structure 110B on the device 101B. Also note that, while the thicker top spacer 143A comprises both the first layer of top spacer material 144 and the second layer of top spacer material 146, the thinner top spacer 143B comprises the first layer of top spacer material 144 but not the second layer of top spacer material 146.

Figure 2F:
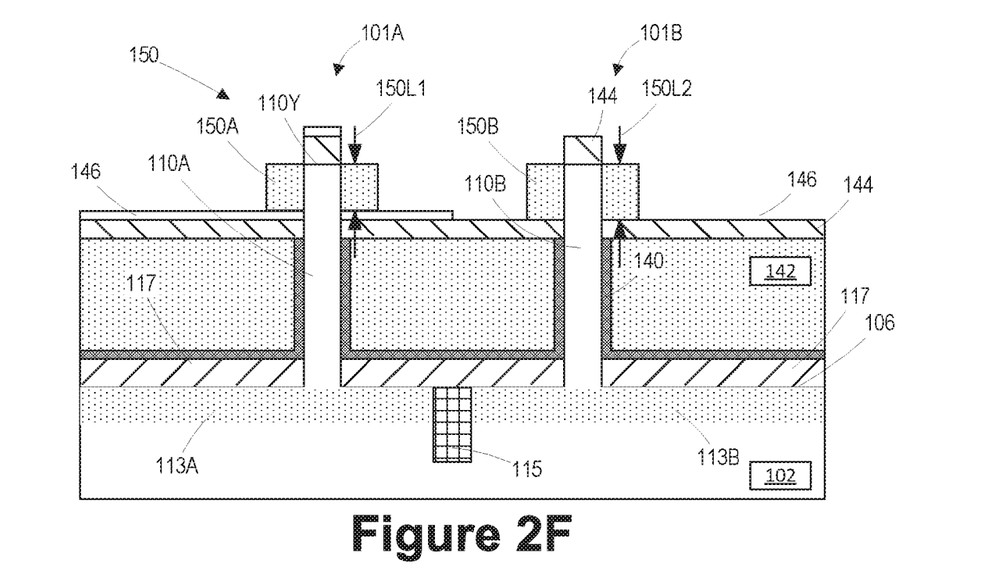

FIG. 2F depicts the product 100 after one or more epitaxial growth processes were performed to form doped top source/drain (S/D) structures 150A, 150B (collectively referred to with the reference numeral 150) on the devices 101A, 101B, respectively. The doped top source/drain (S/D) structure 150A has a vertical thickness 150L1 and the top source/drain (S/D) structure 150B has a vertical thickness 150L2, wherein the thickness 150L1 is less than the thickness 150L2. As noted above, the devices 101A, 101B may be the same type of device, e.g., they both may be P-type devices, or they may be devices of opposite type, as in a CMOS application. If the devices 101 are opposite-type devices, then two separate epitaxial growth processes would be performed through different patterned hard masks (not shown). Accordingly, the doped top source/drain (S/D) structures 150 may be comprised of the same material or different materials depending upon the type of devices under construction. For example, in the case where the device 101A is a P-type device and the device 101B is an N-type device, the doped top source/drain (S/D) structure 150A may be made of SiGe, while the doped top source/drain (S/D) structure 150B may be made of SiC. The doped top source/drain (S/D) structures 150 may be in situ doped with an appropriate dopant (N-type or P-type depending upon the type of device under construction) during the formation of the top source/drain (S/D) structures 150. However, for purposes of simplicity, the doped top source/drain (S/D) structures 150 are shaded the same in the drawings so as to not overly complicate the disclosure of the present subject matter. Of course, after reading the present application, those skilled in the art will appreciate that in manufacturing different device types, the manufacturing process will have to account for various differences that may be present when manufacturing different device types, e.g., different dopant concentrations for N and P devices, different rates of migration of N and P dopants during a common anneal process, perhaps different materials of construction for the vertically-oriented channel semiconductor structures 110 of the different type devices, etc.

Figure 2G:
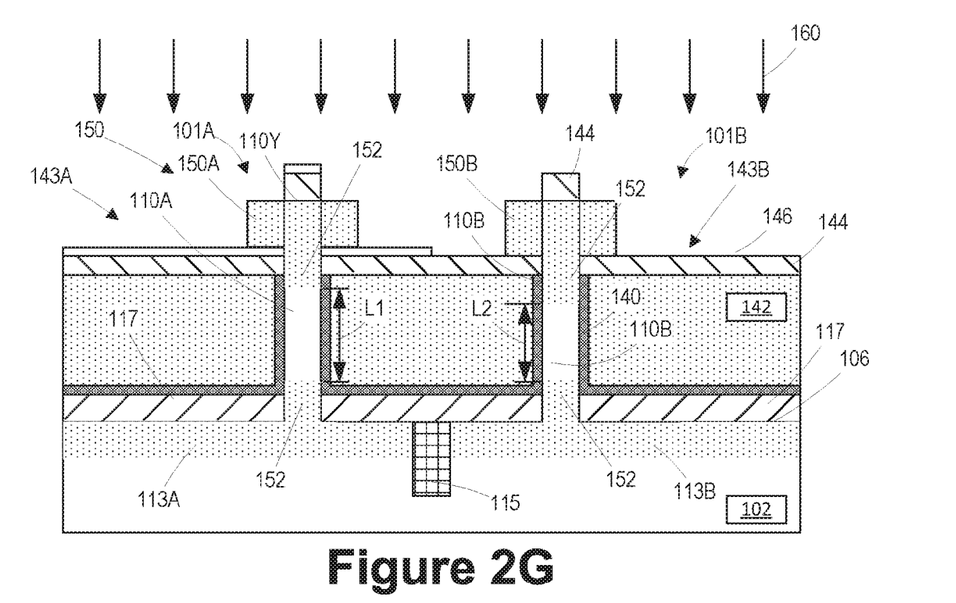

FIG. 2G depicts the product 100 after an anneal process, as depicted by the arrows 160, was performed on the product 100. The anneal process is performed to cause dopant atoms 152 in the top source/drain (S/D) structures 150 and in the bottom source/drain structures 113 to migrate into the vertically-oriented channel semiconductor structures 110 toward the channel regions of the devices 101. In the case where all other physical aspects of the devices 101A and 101B are substantially the same, due primarily to the presence of the thicker top spacer 143A on the first device 101A, the doped top source/drain (S/D) structure 150A is positioned vertically farther away from the channel region for the device 101A as compared to the relatively closer vertical positioning of the doped top source/drain (S/D) structure 150B to the channel region of the device 101B. Accordingly, at the conclusion of the anneal process 160, the dopant atoms 152 from the doped top source/drain (S/D) structure 150B will have migrated downward into the vertically-oriented channel semiconductor structure 110B on the device 101B a greater distance, i.e., deeper, than the dopant atoms 152 from the doped top source/drain (S/D) structure 150A will have migrated into the channel region of the device 101A. Note that, in some cases, a portion of the dopant atoms will migrate to a position partially under the gate structures for the devices 101. Accordingly, the effective channel length L1 on the device 101A will be greater than the effective channel length L2 on the device 101B. The difference in the effective channel lengths L1 and L2 may vary depending upon the particular application, e.g., 1-6 nm. This process operation results in the formation of a lower doped source/drain (S/D) region and an upper source/drain (S/D) region in the vertically-oriented channel semiconductor structures 110. The method of performing the anneal process, the equipment used and the parameters of the anneal process may vary depending upon the particular device under construction. In one illustrative embodiment, the anneal process may be performed in an RTA chamber at a temperature that falls within the range of about 800-1200° C. for a duration of about 1-100 seconds.

Figure 2H:
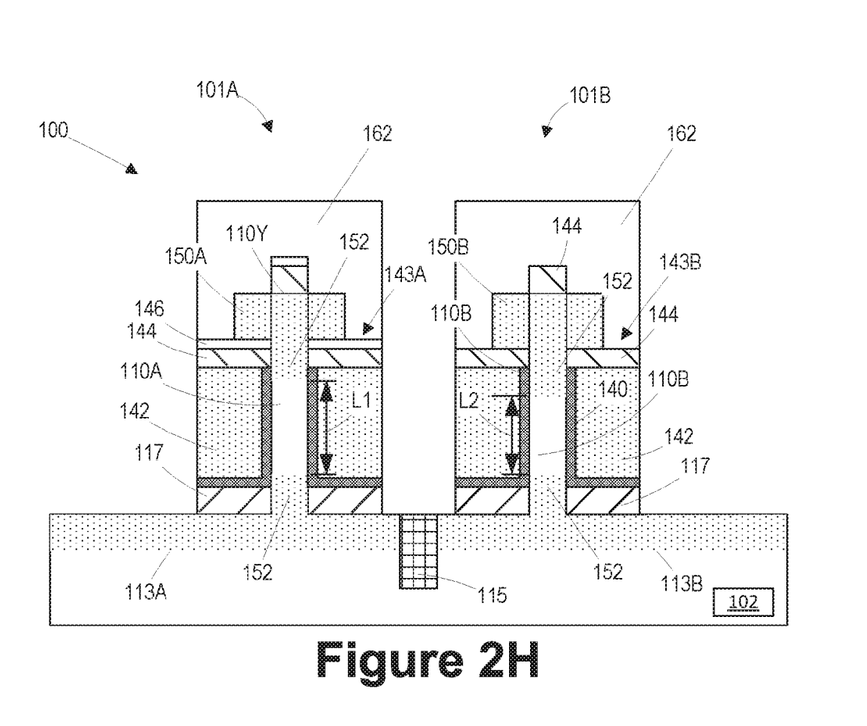

FIG. 2H depicts the product after one or more etching processes were performed through a patterned etch mask 162 to separate the two devices 101A, 101B. At the point of processing depicted in FIG. 2H, the devices 101 are essentially complete and all that remains to be done is to form conductive contacts (to the gate, the lower source drain 117 and the upper source/drain 150 to various portions of the devices using known manufacturing processes and materials, e.g., the formation of one or more insulating layers across the product 100, the formation of appropriate contact openings, lining the contact openings with insulating materials and/or barrier layers if needed and filling the openings with a conductive contact material such as tungsten.

Figure 2I:
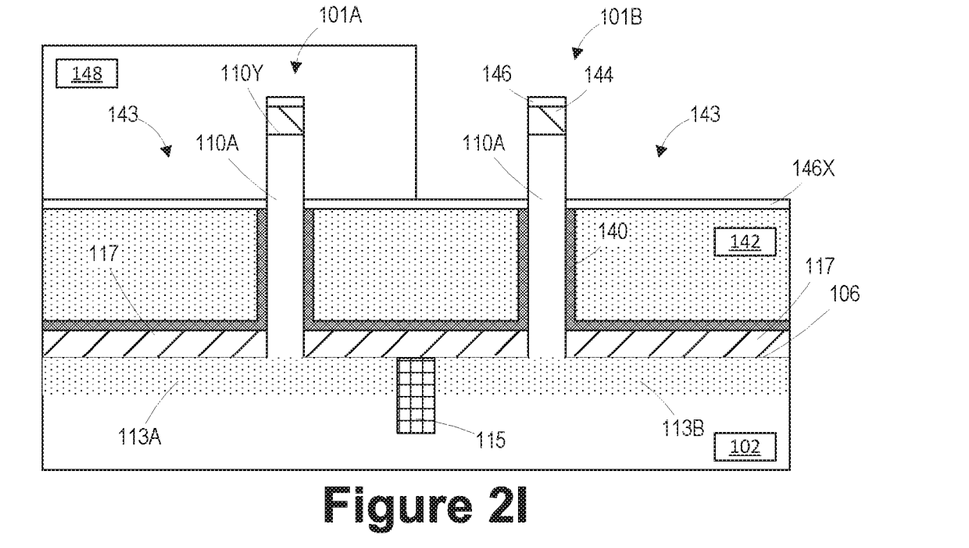
Figure 2J:
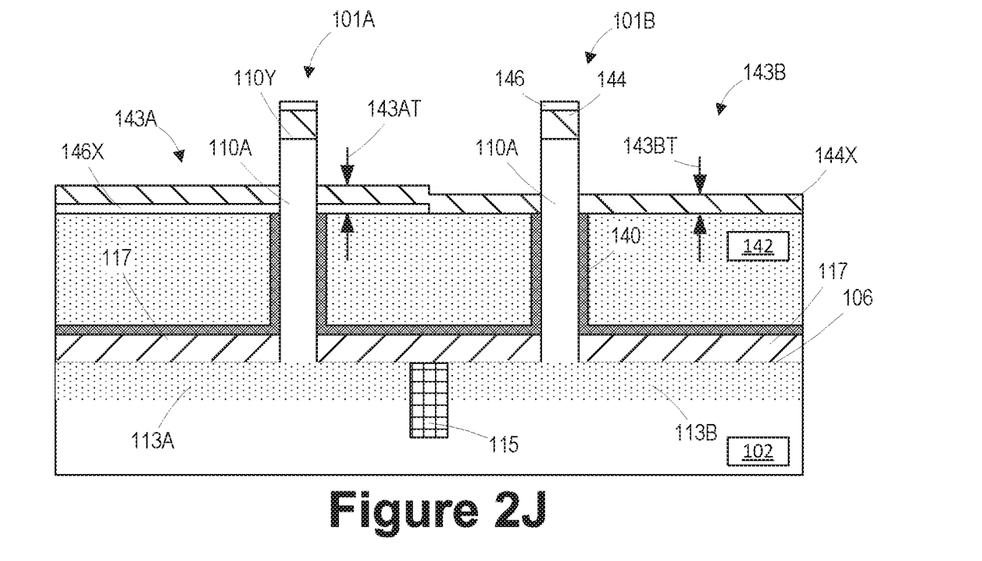

FIGS. 2I-2J depict an alternative process flow for forming devices 101 with top spacers 143 with different thicknesses and devices 101 with different effective channel lengths. FIG. 2I depicts the product at the same point in fabrication as shown in FIG. 2C wherein the following additional steps have been taken. First, in this alternative process flow, a first layer of top spacer material 146X was formed on the product for both of the devices 101. In one embodiment, the first layer of top spacer material 146X may be comprised of the same materials as those for the above-described second layer of top spacer material 146, and the layer 146X may be formed to the same thickness as that of the second layer of top spacer material 146. Then, as shown in FIG. 2I, the above-described patterned etch mask 148 was formed so as to expose the portion of the first layer of top spacer material 146X positioned on the device 101B while covering the first layer of top spacer material 146X positioned on the device 101A.

FIG. 2J depicts the product 100 after several process operations were performed. First, the patterned masking layer 148 was removed. Thereafter, a deposition process, such as direction deposition process (or a deposition-recess etching process), was performed to form a second layer of top spacer material 144X on both devices 101. The layer 144X may be comprised of the same materials as those noted above for the layer 144. This process operation results in the formation of a top spacer 143A with a vertical thickness 143AT for the device 101A and a top spacer 143B with a vertical thickness 143BT for the device 101B, wherein the thickness 143AT is greater than the thickness 143BT. Note that, while the thicker top spacer 143A comprises both the remaining portion of the first layer of top spacer material 146X and the second layer of top spacer material 144X, the thinner top spacer 143B comprises just the second layer of top spacer material 144X. At this point, the above-described process operations beginning with those shown in FIG. 2F may be performed to complete the fabrication of the devices 101.

Figure 2K:
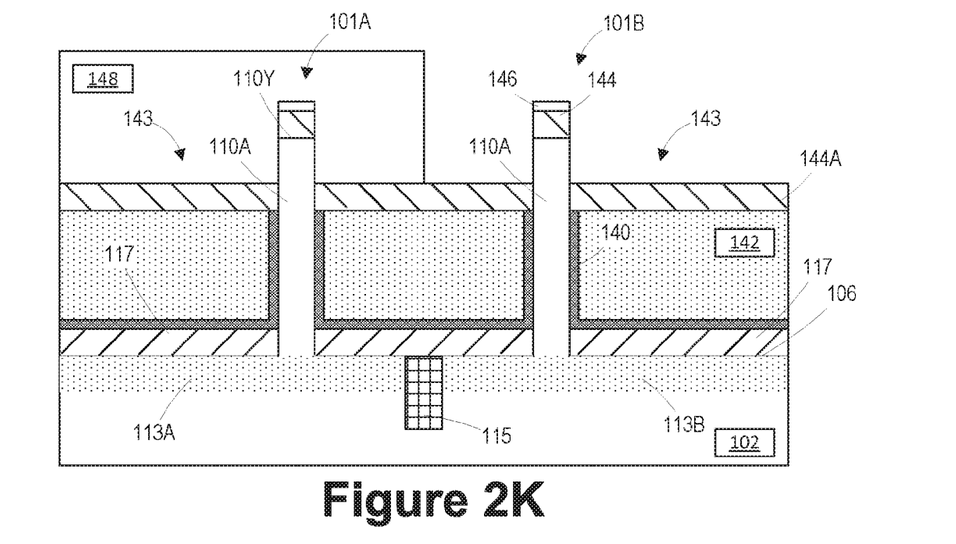
Figure 2L:
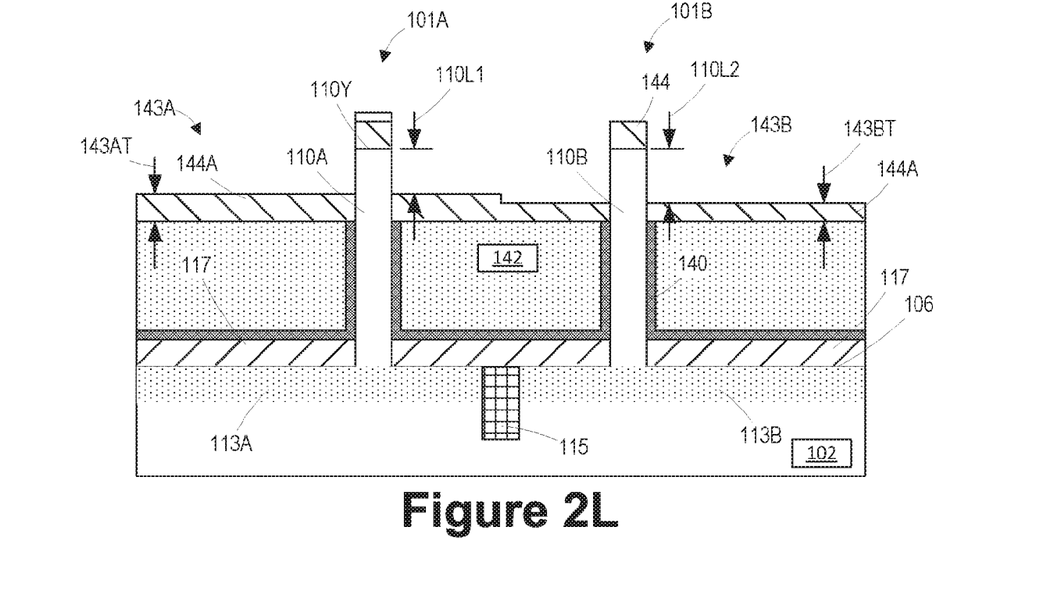

FIGS. 2K-2L depict yet another alternative process flow for forming devices 101 with top spacers 143 with different thicknesses and devices 101 with different effective channel lengths. FIG. 2K depicts the product at the same point in fabrication as shown in FIG. 2D with the following exceptions. First, in this alternative process flow, the second layer of top spacer material 146 has been omitted, and a single layer of spacer material 144A is initially formed on both devices 101. The spacer layer 144A has an as-deposited vertical thickness and it may be made of the same materials as those identified above for the layer 144. As shown in FIG. 2K, the patterned etch mask 148 exposes the portion of the layer of spacer material 144A positioned on the device 101B.

FIG. 2L depicts the product 100 after a timed recess etching process was performed through the patterned etch mask layer 148 to remove a portion of the initial as-deposited vertical thickness of the exposed portion of the layer of top spacer material 144A on the device 101B. This timed recess etching process is different than the selective etching process performed in the above process flow to selectively remove exposed portions of the second layer of top spacer material 146 on the device 101B relative to the first layer of top spacer material 144. Thereafter, the patterned etch mask layer 148 was removed. This process operation results in the formation of a top spacer 143A with a vertical thickness 143AT for the device 101A and a top spacer 143B with a vertical thickness 143BT for the device 101B, wherein the thickness 143AT is greater than the thickness 143BT, and wherein both of the spacers 143A, 143B are made from the same layer of material. Note that the first spacer 143A is comprised of a portion of the layer of top spacer material 144A having the as-deposited vertical thickness or the layer 144A when it was formed, while the spacer 143B is comprised of a reduced-thickness portion of the initially formed layer 144A. At this point, the above-described process operations beginning with those shown in FIG. 2F may be performed to complete the fabrication of the devices 101.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method comprising:
   forming a first and a second vertically-oriented channel semiconductor structure for, respectively, a first and a second vertical transistor device above a semiconductor substrate;
   forming a first and a second top spacer, respectively, around said first and second vertically-oriented channel semiconductor structures, said first and second top spacers having, respectively, a first and a second spacer thickness, wherein said first spacer thickness is greater than said second spacer thickness;
   performing at least one epitaxial deposition process to form:
      a first doped top source/drain structure around said first vertically-oriented channel semiconductor structure and above said first top spacer; and
      a second doped top source/drain structure around said second vertically-oriented channel semiconductor structure and above said second top spacer; and
   performing an anneal process so as to cause:
      dopant atoms in said first doped top source/drain structure to migrate into said first vertically-oriented channel semiconductor structure; and
      dopant atoms in said second doped top source/drain structure to migrate into said second vertically-oriented channel semiconductor structure.

2. The method of claim 1, wherein said first vertical transistor device and said second vertical transistor device are opposite type devices.

3. The method of claim 1, wherein forming said first and said second top spacer comprises:
   performing a first deposition process to form a first layer of top spacer material comprising a first spacer material for both said first and second vertical transistor devices;
   performing a second deposition process to form a second layer of top spacer material comprising a second spacer material on said first layer of top spacer material, wherein said second spacer material is a different material than said first spacer material;
   forming a patterned etch mask above said second layer of top spacer material that exposes a portion of said second layer of top spacer material; and
   performing a selective etching process through said patterned etch mask to selectively remove said exposed portion of said second layer of top spacer material relative to said first layer of top spacer material, wherein said first top spacer comprises said first layer of top spacer material and said second layer of top spacer material and said second top spacer comprises said first layer of top spacer material.

4. The method of claim 1, wherein forming said first and said second top spacer comprises:
   performing a first deposition process to form a first layer of top spacer material for both said first and second vertical transistor devices;
   forming a patterned etch mask above said first layer of top spacer material that exposes a portion of said first layer of top spacer material for said second vertical transistor device;
   performing an etching process through said patterned etch mask to selectively remove said exposed portion of said first layer of top spacer material for said second vertical transistor device and thereby leave a remaining portion of said first layer of top spacer material for said first vertical transistor device;
   removing said patterned etch mask; and
   performing a second deposition process to form a second layer of top spacer material on said remaining portion of said first layer of top spacer material and on said second vertical transistor device, wherein said first top spacer comprises said remaining portion of said first layer of top spacer material and said second layer of top spacer material and said second top spacer comprises said second layer of top spacer material.

5. The method of claim 1, wherein forming said first and said second top spacer comprises:
   performing a deposition process to form a layer of top spacer material for both said first and second vertical transistor devices, said layer of top spacer material having an as-deposited initial vertical thickness;
   forming a patterned etch mask above said layer of top spacer material that exposes a portion of said layer of top spacer material; and
   performing a timed recess etching process through said patterned etch mask to remove a portion of said as-deposited initial vertical thickness of said exposed portion of said layer of top spacer material to thereby defined a reduced-thickness portion of said layer of top spacer material, wherein said first top spacer comprises said layer of top spacer material having said as-deposited initial vertical thickness and said second top spacer comprises said reduced-thickness portion of said layer of top spacer material.

6. The method of claim 2, wherein performing said at least one epitaxial deposition process comprises:
   performing a first epitaxial deposition process to form said first doped top source/drain structure, wherein said first top source/drain structure comprises one of N-type and P-type dopants; and
   performing a second epitaxial deposition process to form said second doped top source/drain structure, wherein said second top source/drain structure comprises dopants that are of an opposite type to said dopants present in said first doped top source/drain structure.

7. The method of claim 1, wherein performing said anneal process comprises performing said anneal process at a temperature that falls within a range of about 800-1200° C. for a duration of about 1-100 seconds.

8. The method of claim 1, wherein said first spacer thickness is about 1-6 nm greater than said second spacer thickness.

9. The method of claim 1, wherein at least one of said first and second vertically-oriented channel semiconductor structures is comprised of a semiconductor material that is different than a semiconductor material of said semiconductor substrate.

10. The method of claim 1, wherein performing said anneal process causes said dopants to migrate such that said first vertical transistor device has a first effective channel length and said second vertical transistor device has a second effective channel length that is less than said first effective channel length of said first vertical transistor device.

11. The method of claim 10, wherein said first effective channel length is about 1-6 nm greater than said second effective channel length.

12. The method of claim 1, wherein the first and a second vertically-oriented channel semiconductor structures have substantially the same physical size and substantially the same overall configuration when viewed from above.

13. A method comprising:
- forming a first and a second vertically-oriented channel semiconductor structure for, respectively, a first and a second vertical transistor device above a semiconductor substrate;
- performing a first deposition process to form a first layer of top spacer material comprising a first spacer material for both said first and second vertical transistor devices;
- performing a second deposition process to form a second layer of top spacer material comprising a second spacer material on said first layer of top spacer material, wherein said second spacer material is a different material than said first spacer material;
- forming a patterned etch mask above said second layer of top spacer material that exposes a portion of said second layer of top spacer material;
- performing a selective etching process through said patterned etch mask to selectively remove said exposed portion of said second layer of top spacer material relative to said first layer of top spacer material so as to define:
  - a first top spacer with a first spacer thickness that is positioned around said first vertically-oriented channel semiconductor structure, said first top spacer comprising said first layer of top spacer material and said second layer of top spacer material; and
  - a second top spacer with a second spacer thickness that is positioned around said second vertically-oriented channel semiconductor, wherein said second top spacer comprises said first layer of top spacer material and wherein said first spacer thickness is greater than said second spacer thickness;
- performing at least one epitaxial deposition process to form:
  - a first doped top source/drain structure around said first vertically-oriented channel semiconductor structure and above said first top spacer; and
  - a second doped top source/drain structure around said second vertically-oriented channel semiconductor structure and above said second top spacer; and
- performing an anneal process so as to cause:
  - dopant atoms in said first doped top source/drain structure to migrate into said first vertically-oriented channel semiconductor structure; and
  - dopant atoms in said second doped top source/drain structure to migrate into said second vertically-oriented channel semiconductor structure.

14. The method of claim 13, wherein said first spacer thickness is about 1-6 nm greater than said second spacer thickness and wherein performing said anneal process causes said dopants to migrate such that first vertical transistor device has a first effective channel length and the second vertical transistor device has a second effective channel length, wherein the first effective channel length is about 1-6 nm greater than said second effective channel length.

15. The method of claim 13, wherein final first and second gate structures for, respectively, said first and second vertical transistor devices are formed prior to the formation of said first layer of top spacer material.

16. The method of claim 13, wherein performing said anneal process causes said dopants to migrate such that said first vertical transistor device has a first effective channel length and said second vertical transistor device has a second effective channel length that is less than said first effective channel length of said first vertical transistor device.

17. A method comprising:
- forming a first and a second vertically-oriented channel semiconductor structure for, respectively, a first and a second vertical transistor device above a semiconductor substrate;
- forming a first and a second top spacer, respectively, around said first and second vertically-oriented channel semiconductor structures, said first and second top spacers having, respectively, a first and a second spacer thickness, wherein said first spacer thickness is about 1-6 nm greater than said second spacer thickness;
- performing at least one epitaxial deposition process to form:
  - a first doped top source/drain structure around said first vertically-oriented channel semiconductor structure and above said first top spacer; and
  - a second doped top source/drain structure around said second vertically-oriented channel semiconductor structure and above said second top spacer; and
- performing an anneal process so as to cause:
  - dopant atoms in said first doped top source/drain structure to migrate into said first vertically-oriented channel semiconductor structure such that said first vertical transistor device has a first effective channel length; and
  - dopant atoms in said second doped top source/drain structure to migrate into said second vertically-oriented channel semiconductor structure such that said second vertical transistor device has a second effective channel length that is about 1-6 nm less than said first effective channel length.

18. The method of claim 17, wherein forming said first and said second top spacer comprises:
- performing a first deposition process to form a first layer of top spacer material comprising a first spacer material for both said first and second vertical transistor devices;
- performing a second deposition process to form a second layer of top spacer material comprising a second spacer material on said first layer of top spacer material, wherein said second spacer material is a different material than said first spacer material;
- forming a patterned etch mask above said second layer of top spacer material that exposes a portion of said second layer of top spacer material; and
- performing a selective etching process through said patterned etch mask to selectively remove said exposed portion of said second layer of top spacer material relative to said first layer of top spacer material, wherein said first top spacer comprises said first layer of top spacer material and said second layer of top spacer material and said second top spacer comprises said first layer of top spacer material.

19. The method of claim 17, wherein forming said first and said second top spacer comprises:
- performing a first deposition process to form a first layer of top spacer material for both said first and second vertical transistor devices;
- forming a patterned etch mask above said first layer of top spacer material that exposes a portion of said first layer of top spacer material for said second vertical transistor device;
- performing an etching process through said patterned etch mask to selectively remove said exposed portion of said first layer of top spacer material for said second vertical transistor device and thereby leave a remaining portion of said first layer of top spacer material for said first vertical transistor device;

removing said patterned etch mask; and performing a second deposition process to form a second layer of top spacer material on said remaining portion of said first layer of top spacer material and on said second vertical transistor device, wherein said first top spacer comprises said remaining portion of said first layer of top spacer material and said second layer of top spacer material and said second top spacer comprises said second layer of top spacer material.

20. The method of claim 17, wherein forming said first and said second top spacer comprises:

performing a deposition process to form a layer of top spacer material for both said first and second vertical transistor devices, said layer of top spacer material having an as-deposited initial vertical thickness;

forming a patterned etch mask above said layer of top spacer material that exposes a portion of said layer of top spacer material; and performing a timed recess etching process through said patterned etch mask to remove a portion of said as-deposited initial vertical thickness of said exposed portion of said layer of top spacer material to thereby defined a reduced-thickness portion of said layer of top spacer material, wherein said first top spacer comprises said layer of top spacer material having said as-deposited initial vertical thickness and said second top spacer comprises said reduced-thickness portion of said layer of top spacer material.

\* \* \* \* \*